(12) United States Patent
Wu et al.

(10) Patent No.: US 12,463,043 B2
(45) Date of Patent: Nov. 4, 2025

(54) WAFER PROCESSING METHOD

(71) Applicant: Powerchip Semiconductor Manufacturing Corporation, Hsinchu (TW)

(72) Inventors: Chun-Fu Wu, Hsinchu (TW); Shih-Ping Lee, Hsinchu (TW); Yu-Chun Huo, Hsinchu County (TW); Chih Feng Sung, Hsinchu (TW); Ming-Jui Tsai, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 373 days.

(21) Appl. No.: 18/322,579

(22) Filed: May 23, 2023

(65) Prior Publication Data

US 2024/0355628 A1    Oct. 24, 2024

(30) Foreign Application Priority Data

Apr. 19, 2023    (TW) ................. 112114576

(51) Int. Cl.
| | |
|---|---|
| *H01L 21/304* | (2006.01) |
| *H01L 21/683* | (2006.01) |
| H01L 21/306 | (2006.01) |
| H01L 21/50 | (2006.01) |

(52) U.S. Cl.
CPC ........ *H01L 21/304* (2013.01); *H01L 21/6836* (2013.01); *H01L 21/30625* (2013.01); *H01L 21/50* (2013.01); *H01L 21/683* (2013.01); *H01L 21/6835* (2013.01); *H01L 2221/6834* (2013.01)

(58) Field of Classification Search
CPC ............... H01L 21/304; H01L 21/6836; H01L 21/30625; H01L 2221/68327; H01L 2221/6834; H01L 2221/68381; H01L 21/6835; H01L 21/50
USPC ......................................................... 438/459
See application file for complete search history.

(56) References Cited

U.S. PATENT DOCUMENTS

| | | | | |
|---|---|---|---|---|
| 5,258,323 | A * | 11/1993 | Sarma ................... | H01L 21/764 438/164 |
| 6,924,236 | B2 * | 8/2005 | Yano ................... | H01L 21/3212 438/692 |
| 7,790,569 | B2 | 9/2010 | Knechtel et al. | |

(Continued)

FOREIGN PATENT DOCUMENTS

TW            201832360            9/2018

OTHER PUBLICATIONS

"Office Action of Taiwan Counterpart Application", issued on Oct. 26, 2023, p. 1-p. 6.

*Primary Examiner* — Vu A Vu
(74) *Attorney, Agent, or Firm* — JCIPRNET

(57) ABSTRACT

A wafer processing method including following steps is provided. A release layer is formed on a first wafer. An adhesive layer is formed on a second wafer. One of the first wafer and the second wafer is a device wafer. The device wafer includes a valid die region and a trimming region. A handler is applied to place the first wafer on the second wafer, so that the release layer and the adhesive layer are bonded to each other, and the adhesive layer completely covers the valid die region. During the process of placing the first wafer on the second wafer, the handler directly moves the first wafer.

16 Claims, 11 Drawing Sheets

(56) References Cited

U.S. PATENT DOCUMENTS

| | | | |
|---|---|---|---|
| 8,119,500 B2* | 2/2012 | Yang | H01L 21/2007 |
| | | | 438/455 |
| 8,278,189 B2* | 10/2012 | Hsieh | H01L 21/6835 |
| | | | 430/455 |
| 8,293,063 B2* | 10/2012 | Thallner | H01L 21/02002 |
| | | | 438/455 |
| 8,764,026 B2 | 7/2014 | George et al. | |
| 8,852,391 B2* | 10/2014 | McCutcheon | H01L 21/68721 |
| | | | 156/941 |
| 8,912,045 B2* | 12/2014 | Dang | H01L 24/97 |
| | | | 438/612 |
| 9,023,716 B2* | 5/2015 | Lee | B32B 37/1284 |
| | | | 438/464 |
| 9,087,873 B2* | 7/2015 | Owada | H10D 62/117 |
| 9,157,014 B2* | 10/2015 | Luo | H01L 21/6835 |
| 9,269,561 B2* | 2/2016 | Dang | H01L 21/02002 |
| 9,623,648 B2* | 4/2017 | Kim | B32B 43/006 |
| 10,157,766 B2* | 12/2018 | Kang | H01L 21/6836 |
| 10,224,229 B2 | 3/2019 | Andry et al. | |
| 10,468,400 B2* | 11/2019 | Kang | H01L 24/94 |
| 10,580,823 B2* | 3/2020 | Zhang | H01L 24/08 |
| 10,734,285 B2* | 8/2020 | Li | H01L 24/94 |
| 10,894,935 B2* | 1/2021 | Kang | C11D 3/30 |
| 11,195,740 B2* | 12/2021 | Bayless | H01L 21/30625 |
| 11,482,506 B2* | 10/2022 | Hsieh | H01L 25/50 |
| 11,876,077 B2* | 1/2024 | Lo | H01L 21/76898 |
| 12,068,165 B2* | 8/2024 | Yamamoto | H01L 22/20 |
| 12,094,758 B2* | 9/2024 | Hung | H01L 23/3178 |
| 2012/0058623 A1 | 3/2012 | Hsieh | |

* cited by examiner

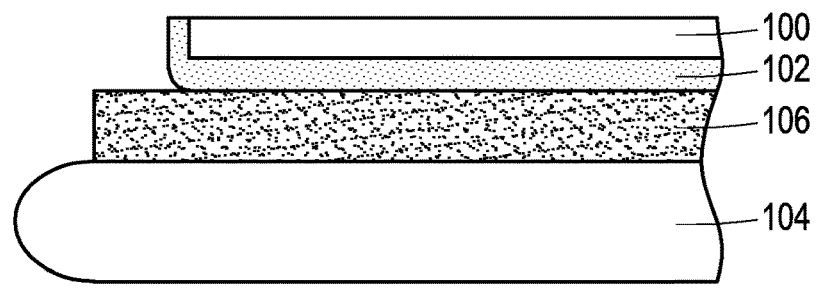
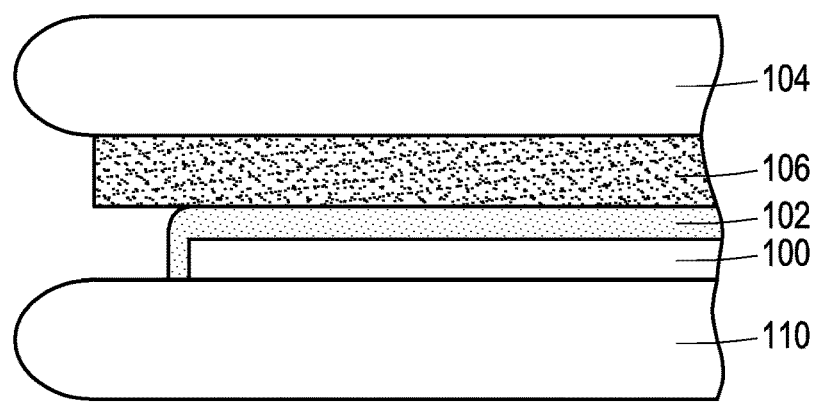
FIG. 1C
FIG. 1D

WAFER PROCESSING METHOD

CROSS-REFERENCE TO RELATED APPLICATION

This application claims the priority benefit of Taiwan patent application serial no. 112114576, filed on Apr. 19, 2023. The entirety of the above-mentioned patent application is hereby incorporated by reference herein and made a part of this specification.

BACKGROUND

Technical Field

The disclosure relates to a processing method; more particularly, the disclosure relates to a wafer processing method.

Description of Related Art

According to the conventional art, a device wafer is bonded to a carrier wafer, and a subsequent manufacturing process is then performed on the device wafer. However, during the subsequent manufacturing process (e.g., a thinning process) performed on the device wafer that is bonded to the carrier wafer, fractures of the device wafer often occur, thus leading to damages to a valid die region of the device wafer.

SUMMARY

The disclosure provides a wafer processing method capable of preventing damages to a valid die region of a device wafer bonded to a carrier wafer in a subsequent manufacturing process.

In an embodiment of the disclosure, a wafer processing method including following steps is provided. A release layer is formed on a first wafer. An adhesive layer is formed on a second wafer, where one of the first wafer and the second wafer is a device wafer, and the device wafer includes a valid die region and a trimming region. The first wafer is placed on the second wafer by a handler, so that the release layer and the adhesive layer are bonded to each other, and the adhesive layer completely covers the valid die region. During the process of placing the first wafer on the second wafer, the handler directly moves the first wafer.

According to an embodiment of the disclosure, the first wafer is the device wafer, and the second wafer is a carrier wafer.

According to an embodiment of the disclosure, the first wafer includes the valid die region and the trimming region, and the trimming region is located on one side of the valid die region and adjacent to an edge of the first wafer.

According to an embodiment of the disclosure, a space between the first wafer and the second wafer in the valid die region is filled with the release layer and the adhesive layer.

According to an embodiment of the disclosure, the first wafer has a recess in the trimming region, and the recess is located on one side of the first wafer adjacent to the second wafer.

According to an embodiment of the disclosure, a space between the first wafer and the second wafer in the trimming region is not filled by the release layer and the adhesive layer.

According to an embodiment of the disclosure, the wafer processing method may further include following steps. A thinning process is performed on the first wafer. The first wafer is bonded to a third wafer. The release layer is removed to separate the first wafer from the second wafer.

According to an embodiment of the disclosure, a portion of the first wafer located in the trimming region is completely removed by the thinning process.

According to an embodiment of the disclosure, the second wafer is a transparent wafer, and the release layer is removed by a laser.

According to an embodiment of the disclosure, the first wafer is a carrier wafer, and the second wafer is the device wafer.

According to an embodiment of the disclosure, the second wafer includes the valid die region and the trimming region, and the trimming region is located on one side of the valid die region and adjacent to an edge of the second wafer.

According to an embodiment of the disclosure, a space between the first wafer and the second wafer in the valid die region is filled with the release layer and the adhesive layer.

According to an embodiment of the disclosure, the second wafer has a recess in the trimming region, and the recess is located on one side of the second wafer adjacent to the first wafer.

According to an embodiment of the disclosure, a space between the first wafer and the second wafer in the trimming region is not filled with the release layer and the adhesive layer.

According to an embodiment of the disclosure, the wafer processing method further includes following steps. A thinning process is performed on the second wafer. The second wafer is bonded to a third wafer. The release layer is removed to separate the first wafer from the second wafer.

According to an embodiment of the disclosure, after the release layer and the adhesive layer are bonded to each other, the release layer completely covers the valid die region.

In an embodiment of the disclosure, another wafer processing method including following steps is provided. A release layer is formed on a first wafer, where the first wafer is a device wafer. An adhesive layer is formed on a second wafer, where the second wafer is a carrier wafer having a recess, and the adhesive layer is located in the recess. The first wafer is placed on the second wafer by a handler, or the second wafer is placed on the first wafer by the handler, so that the release layer and the adhesive layer are bonded to each other.

According to an embodiment of the disclosure, the recess is not extended to an edge of the second wafer.

According to another embodiment of the disclosure, the adhesive layer is not extended to a top surface of the second wafer.

According to another embodiment of the disclosure, after the release layer and the adhesive layer are bonded to each other, the release layer completely covers the valid die region.

In view of the above, according to the wafer processing method provided in some embodiments of the disclosure, one of the first wafer and the second wafer is the device wafer which includes the valid die region and the trimming region. Besides, the first wafer is placed on the second wafer by the handler, so as to allow the release layer and the adhesive layer to be bonded to each other, and the adhesive layer completely covers the valid die region. During the process of placing the first wafer on the second wafer, the handler directly moves the first wafer on which the release layer is formed. After the release layer and the adhesive layer are bonded to each other, since the adhesive layer completely covers the valid die region, gaps between the first wafer and the second wafer in the valid die region may be prevented. In some embodiments, the first wafer may be the device wafer, and the second wafer may be the carrier wafer. In other embodiments, the first wafer may be the carrier wafer, and the second wafer may be the device wafer. Thereby, damages to the valid die region of the device wafer bonded to the carrier wafer may be prevented in the subsequent manufacturing process (e.g., the thinning process).

Besides, in the wafer processing method provided by other embodiments of the disclosure, the carrier wafer has the recess where the adhesive layer is located, gaps between the device wafer and the carrier wafer in the valid die region may be prevented. As such, damages to the valid die region of the device wafer bonded to the carrier wafer may be prevented in the subsequent manufacturing process (e.g., the thinning process).

To make the above more comprehensible, several embodiments accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1A to FIG. 1E are cross-sectional views illustrating wafer processing steps according to some embodiments of the disclosure.

DESCRIPTION OF THE EMBODIMENTS

Figure 1A:
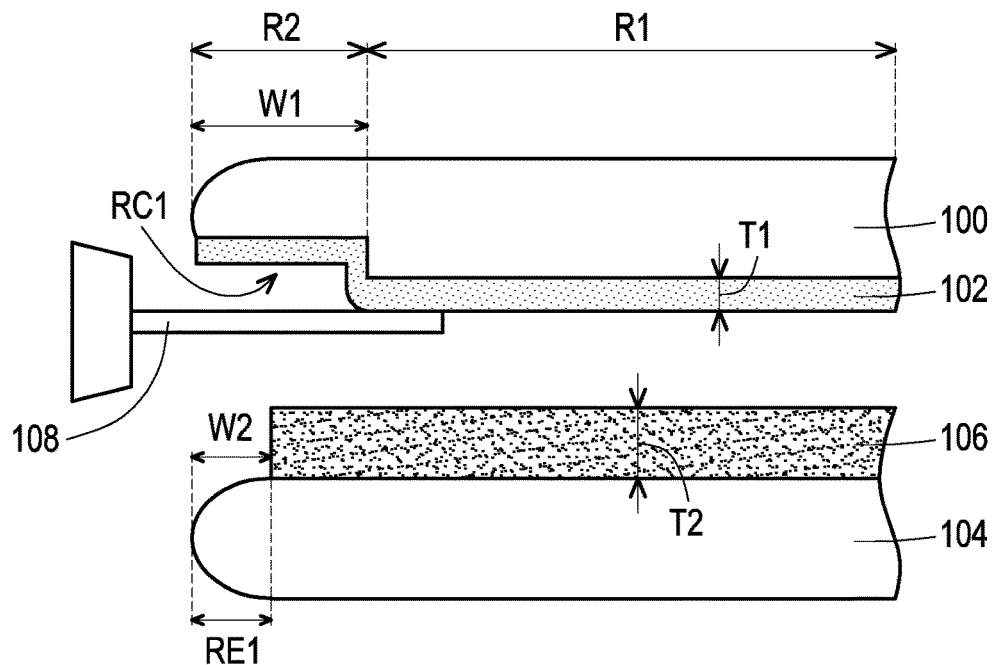
Figure 1B:
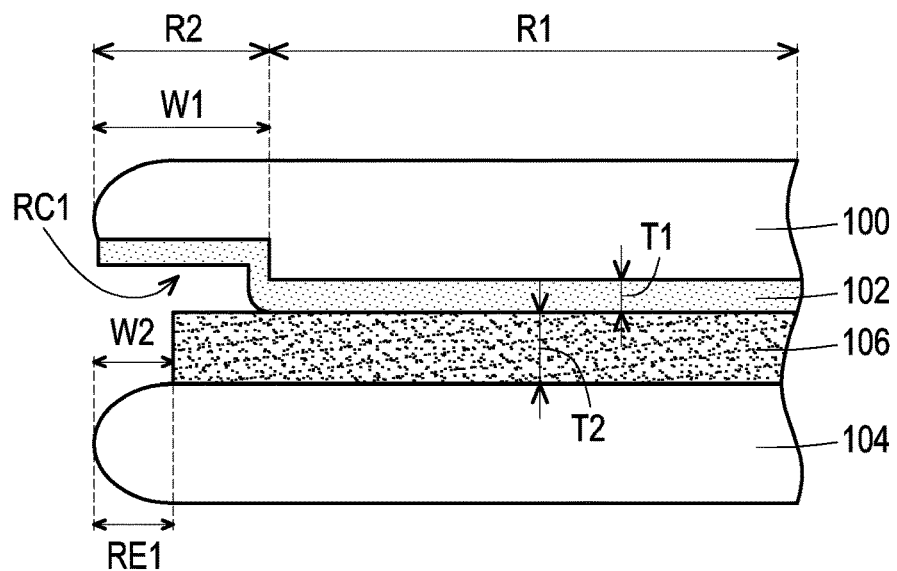

FIG. 1A to FIG. 1E are cross-sectional views illustrating wafer processing steps according to some embodiments of the disclosure. With reference to FIG. 1A and FIG. 1B, a release layer 102 is formed on a wafer 100. In some embodiments, the wafer 100 may be a device wafer. In the disclosure, the device wafer may be a wafer having semiconductor devices (e.g., transistor devices and/or memory devices), interconnect structures, and other required components.

In some embodiments, the wafer 100 includes a valid die region R1 and a trimming region R2. The trimming region R2 is located on one side of the valid die region R1 and adjacent to an edge of the wafer 100. In some embodiments, a width W1 of the trimming region R2 may be 0.1 mm-6 mm. In some embodiments, the wafer 100 may have a recess RC1 in the trimming region R2. In some embodiments, the recess RC1 may be formed by performing a polishing process on the wafer 100 in the trimming region R2. In some embodiments, a thickness T1 of the release layer 102 may be 0.5 μm-5 μm. In some embodiments, a method of forming the release layer 102 includes, for instance, a spin coating method.

Besides, an adhesive layer 106 is formed on a wafer 104. In some embodiments, the wafer 104 may be a carrier wafer. In this disclosure, the carrier wafer may be a wafer configured to carry the device wafer. In some embodiments, the wafer 104 may be a transparent wafer. In some embodiments, the wafer 104 may be a glass wafer. In some embodiments, a thickness T2 of the adhesive layer 106 may be 5 μm-15 μm. In some embodiments, a method of forming the adhesive layer 106 includes, for instance, a spin coating method. In some embodiments, an edge bead removal (EBR) process may be performed on the adhesive layer 106. In some embodiments, the EBR process may be performed on an edge region RE1 of the wafer 104, and a width W2 of the edge region RE1 may be 0 mm-5 mm. In some embodiments, the width W1 of the trimming region R2 is required to be greater than the width W2 of the edge region RE1.

Next, the wafer 100 is placed on the wafer 104 by a handler 108, so that the release layer 102 and the adhesive layer 106 are bonded to each other, and the adhesive layer 106 completely covers the valid die region R1. During the process of placing the wafer 100 on the wafer 104, the handler 108 directly moves the wafer 100 on which the release layer 102 is formed. After the release layer 102 and the adhesive layer 106 are bonded to each other, since the adhesive layer 106 completely covers the valid die region R1, gaps may be prevented from being generated between the wafer 100 and the wafer 104 in the valid die region R1. In some embodiments, after the release layer 102 and the adhesive layer 106 are bonded to each other, the release layer 102 is able to completely cover the valid die region R1. In some embodiments, as shown in FIG. 1B, a space between the wafer 100 and the wafer 104 in the valid die region R1 may be filled with the release layer 102 and the adhesive layer 106. Thereby, the valid die region R1 of the wafer 100 (the device wafer) bonded to the wafer 104 (the carrier wafer) may be prevented from being damaged in a subsequent manufacturing process (e.g., a thinning process). In some embodiments, a space between the wafer 100 and the wafer 104 in the trimming region R2 is not filled with the release layer 102 and the adhesive layer 106. In some embodiments, the handler 108 may be a robot arm.

In this embodiment, as shown in FIG. 1A, during the process of placing the wafer 100 on the wafer 104, the handler 108 may directly contact the release layer 102 on the wafer 100, which should however not be construed as a limitation in the disclosure. In some other embodiments, the release layer 102 may expose the wafer 100 in the trimming region R2, and during the process of placing the wafer 100 on the wafer 104, the handler 108 may directly contact the wafer 100 exposed by the release layer 102.

With reference to FIG. 1C, a thinning process may be performed on the wafer 100. In addition, since there is no gap between the wafer 100 and the wafer 104 in the valid die region R1, damages to the valid die region R1 of the wafer 100 in the thinning process may be prevented. In some embodiments, the thinning process includes, for instance, a polishing process, a chemical mechanical polishing (CMP) process, or a combination thereof. In some embodiments, the thinning process may be performed to completely remove a portion of the wafer 100 in the trimming region R2.

With reference to FIG. 1D, the wafer 100 may be bonded to a wafer 110. In some embodiments, the wafer 110 may be a device wafer. In some embodiments, a method of bonding the wafer 100 and the wafer 110 includes, for instance, a hybrid bonding method or a fusion bonding method.

Figure 1E:
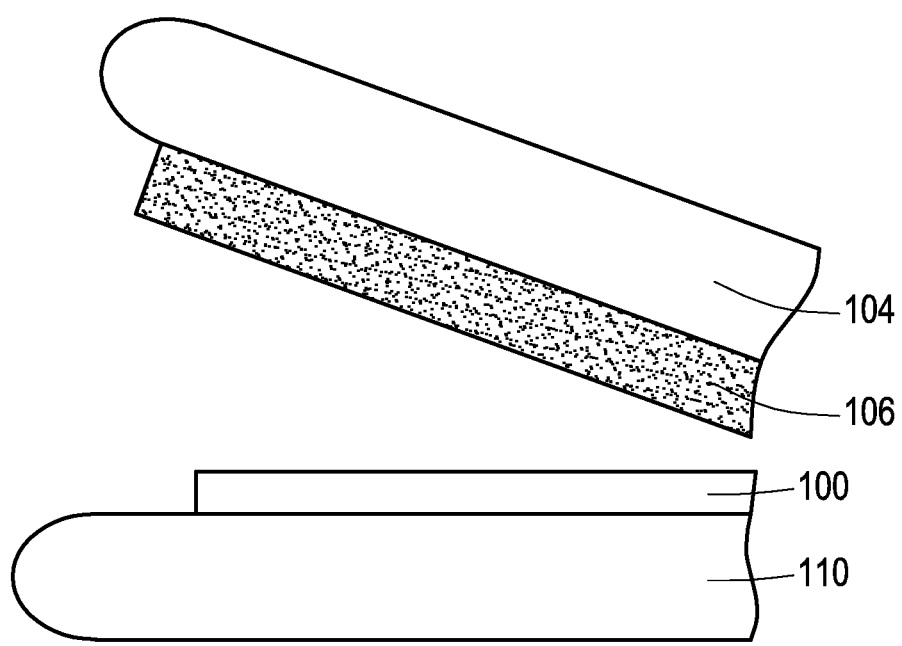

With reference to FIG. 1E, the release layer 102 may be removed, so as to separate the wafer 100 from the wafer 104. In some embodiments, since the wafer 104 is a transparent wafer, the release layer 102 may be removed by a laser. In some embodiments, a cleaning process may be performed on the wafer 100, so as to remove the remaining release layer 102 the wafer 100.

In light of the above embodiment, it may be learned that in the wafer processing method, the wafer 100 is placed on the wafer 104 by the handler 108, so that the release layer 102 and the adhesive layer 106 are bonded to each other, and the adhesive layer 106 completely covers the valid die region R1. During the process of placing the wafer 100 on the wafer 104, the handler 108 directly moves the wafer 100 where the release layer 102 is formed. After the release layer 102 and the adhesive layer 106 are bonded to each other, since the adhesive layer 106 completely covers the valid die region R1, gaps may be prevented from being generated between the wafer 100 and the wafer 104 in the valid die region R1. Thereby, the valid die region R1 of the wafer 100 (the device wafer) bonded to the wafer 104 (the carrier wafer) may be prevented from being damaged in a subsequent manufacturing process (e.g., the thinning process).

FIG. 2A to FIG. 2E are cross-sectional views illustrating wafer processing steps according to other embodiments of the disclosure.

Figure 2A:
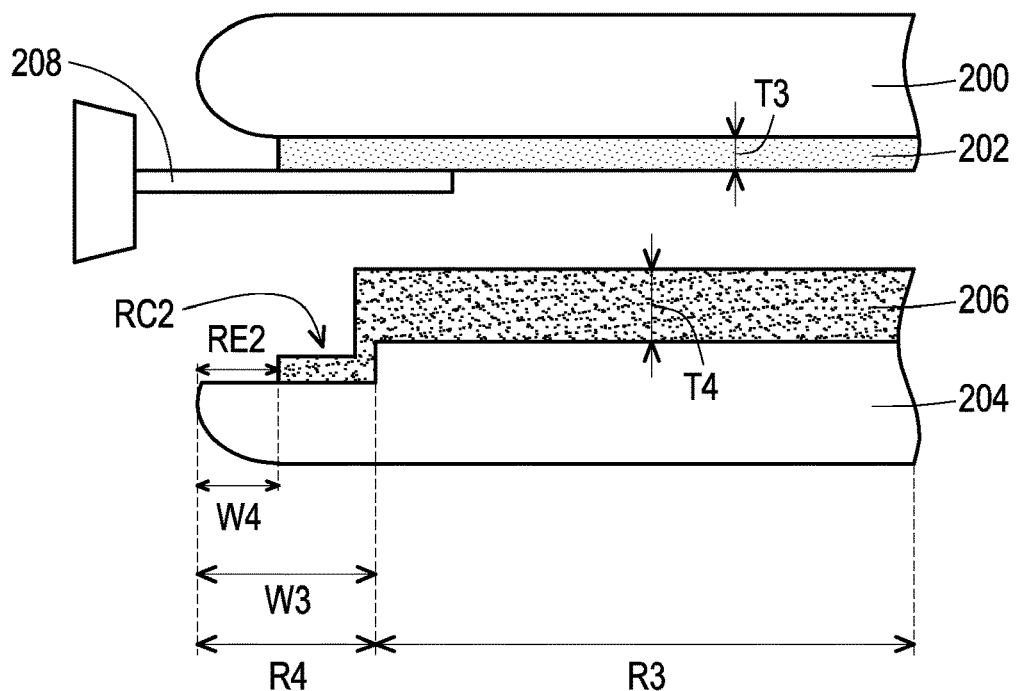
FIG. 2A to FIG. 2E are cross-sectional views illustrating wafer processing steps according to other embodiments of the disclosure.
Figure 2B:
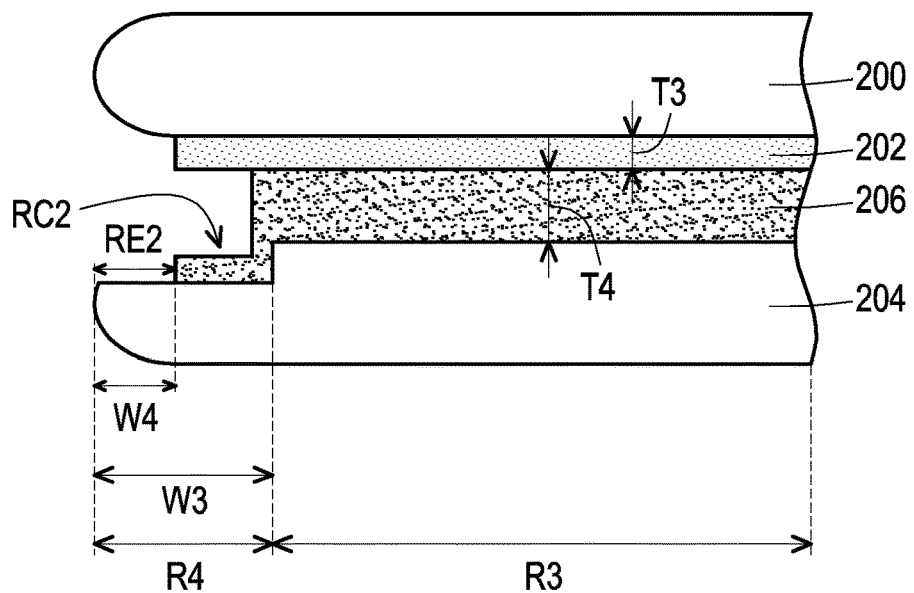

With reference to FIG. 2A and FIG. 2B, a release layer 202 is formed on a wafer 200. In some embodiments, the wafer 200 may be a carrier wafer. In some embodiments, the wafer 200 may be a transparent wafer. In some embodiments, the wafer 200 may be a glass wafer. In some embodiments, a thickness T3 of the release layer 202 may be 0.5 µm-5 µm. In some embodiments, a method of forming the release layer 202 includes, for instance, a spin coating method.

In addition, an adhesive layer 206 is formed on a wafer 204. In some embodiments, the wafer 204 may be a device wafer. In some embodiments, the wafer 204 includes a valid die region R3 and a trimming region R4. The trimming region R4 is located on one side of the valid die region R3 and adjacent to an edge of the wafer 204. In some embodiments, a width W3 of the trimming region R4 may be 0.1 mm-6 mm. In some embodiments, the wafer 204 may have a recess RC2 in the trimming region R4. In some embodiments, the recess RC2 may be formed by performing a polishing process on the wafer 204 in the trimming region R4. In some embodiments, a thickness T4 of the adhesive layer 206 may be 5 µm-15 µm. In some embodiments, a method of forming the adhesive layer 206 includes, for instance, a spin coating method. In some embodiments, an EBR process may be performed on the adhesive layer 206. In some embodiments, the EBR process may be performed on an edge region RE2 of the wafer 204, and a width W4 of the edge region RE2 may be 0 mm-5.9 mm. In some embodiments, the width W3 of the trimming region R4 is required to be greater than the width W4 of the edge region RE2.

Next, the wafer 200 is placed on the wafer 204 by a handler 208, so that the release layer 202 and the adhesive layer 206 are bonded to each other, and the adhesive layer 206 completely covers the valid die region R3. In the process of placing the wafer 200 on the wafer 204, the handler 208 directly moves the wafer 200 where the release layer 202 is located. After the release layer 202 and the adhesive layer 206 are bonded to each other, since the adhesive layer 206 completely covers the valid die region R3, gaps may be prevented from being generated between the wafer 200 and the wafer 204 in the valid die region R3. In some embodiments, after the release layer 202 and the adhesive layer 206 are bonded to each other, the release layer 202 may completely cover the valid die region R3. In some embodiments, as shown in FIG. 2B, a space between the wafer 200 and the wafer 204 in the valid die region R3 may be filled with the release layer 202 and the adhesive layer 206. As such, the valid die region R3 of the wafer 204 (the device wafer) bonded to the wafer 200 (the carrier wafer) may be prevented from being damaged in a subsequent manufacturing process (e.g., a thinning process). In some embodiments, a space between the wafer 200 and the wafer 204 in the trimming region R4 is not filled with the release layer 202 and adhesive layer 206. In some embodiments, the handler 208 may be a robot arm.

In this embodiment, as shown in FIG. 2A, in the process of placing the wafer 200 on the wafer 204, the handler 208 may directly contact the release layer 202 on the wafer 200, which should however not be construed as a limitation in the disclosure. In some other embodiments, the release layer 202 may expose the wafer 200 in the trimming region R4, and during the process of placing the wafer 200 on the wafer 204, the handler 208 may directly contact the wafer 200 exposed by the release layer 202.

Figure 2C:
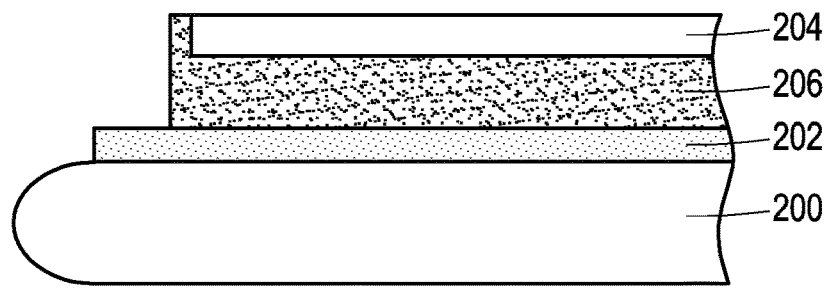

With reference to FIG. 2C, a thinning process may be performed on the wafer 204. In addition, since there is no gap between the wafer 200 and the wafer 204 in the valid die region R3, damages to the valid die region R3 of the wafer 204 in the thinning process may be prevented. In some embodiments, the thinning process includes, for instance, a polishing process, a CMP process, or a combination thereof. In some embodiments, the thinning process may be performed to completely remove a portion of the wafer 204 in the trimming region R4.

Figure 2D:
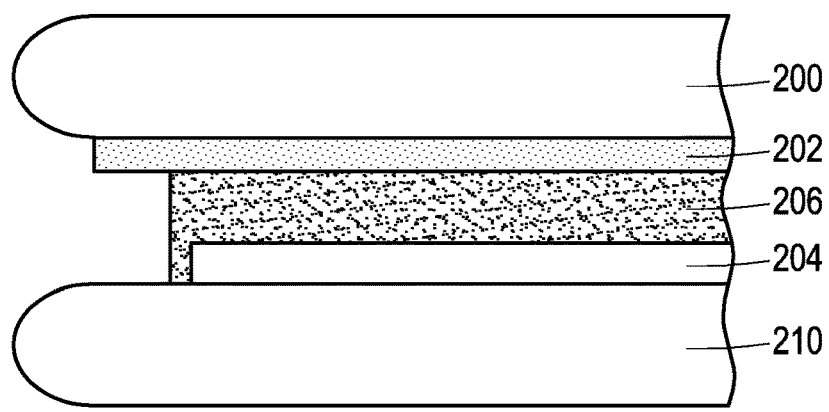

With reference to FIG. 2D, the wafer 204 may be bonded to a wafer 210. In some embodiments, the wafer 210 may be a device wafer. In some embodiments, a method of bonding the wafer 204 and the wafer 210 includes, for instance, a hybrid bonding method or a fusion bonding method.

Figure 2E:
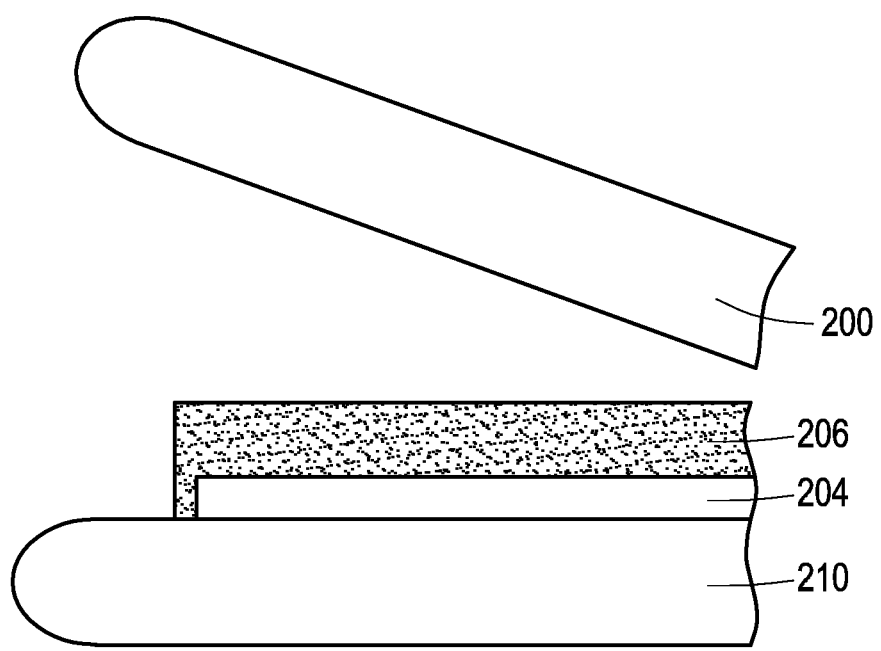

With reference to FIG. 2E, the release layer 202 may be removed, so as to separate the wafer 200 from the wafer 204. In some embodiments, since the wafer 200 is a transparent wafer, the release layer 202 may be removed by a laser. Besides, in the subsequent manufacturing process, whether to remove the adhesive layer 206 on the wafer 204 may be determined according to actual needs.

In light of the above embodiment, it may be learned that in the wafer processing method, the wafer 200 is placed on the wafer 204 by the handler 208, so that the release layer 202 and the adhesive layer 206 are bonded to each other, and the adhesive layer 206 completely covers the valid die region R3. During the process of placing the wafer 200 on the wafer 204, the handler 208 directly moves the wafer 200 where the release layer 202 is formed. After the release layer 202 and the adhesive layer 206 are bonded to each other, since the adhesive layer 206 completely covers the valid die region R3, gaps may be prevented from being generated between the wafer 200 and the wafer 204 in the valid die region R3. Thereby, the valid die region R3 of the wafer 204 (the device wafer) bonded to the wafer 200 (the carrier wafer) may be prevented from being damaged in a subsequent manufacturing process (e.g., the thinning process).

FIG. 3A to FIG. 3J are cross-sectional views illustrating wafer processing steps according to other embodiments of the disclosure.

Figure 3A:
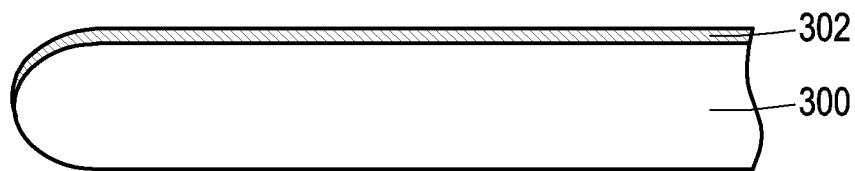
FIG. 3A to FIG. 3J are cross-sectional views illustrating wafer processing steps according to other embodiments of the disclosure.

With reference to FIG. 3A, a negative photoresist material layer 302 may be formed on a wafer 300. In some embodiments, a method of forming the negative photoresist material layer 302 includes, for instance, a spin coating method.

Figure 3B:
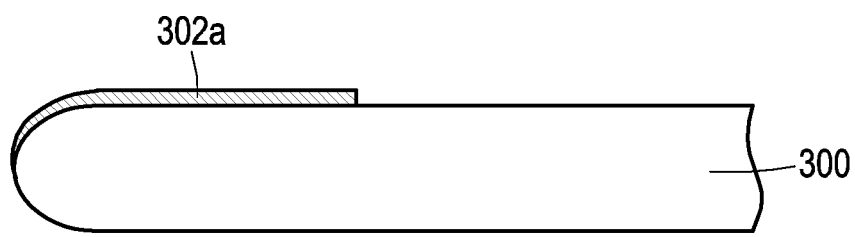

With reference to FIG. 3B, an exposure process and a development process may be performed on the negative photoresist material layer 302 to form a patterned negative photoresist layer 302a. The patterned negative photoresist layer 302a may expose a portion of the wafer 300. In some embodiments, the exposure process may be a wafer edge exposure (WEE) process.

Figure 3C:
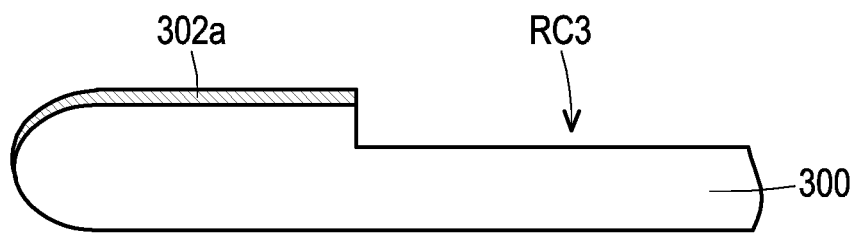

With reference to FIG. 3C, the patterned negative photoresist layer 302a may serve as a mask to remove the portion of the wafer 300 to form a recess RC3. The recess RC3 is formed by performing the aforesaid method, which should however not be construed as a limitation in the disclosure.

Figure 3D:
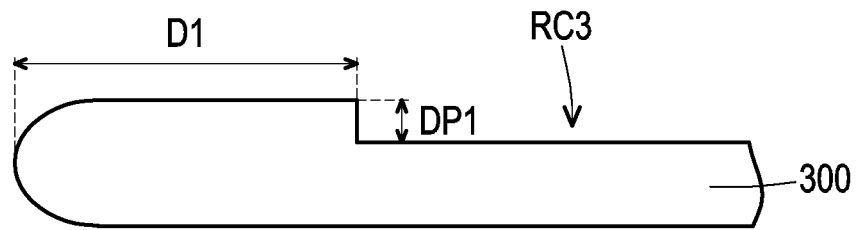

With reference to FIG. 3D, the patterned negative photoresist layer 302a may be removed. In some embodiments, a method of removing the patterned negative photoresist layer 302a includes, for instance, a dry stripping method or a wet stripping method.

The wafer 300 in this embodiment will be described with reference to FIG. 3D. In this embodiment, the wafer 300 may be a carrier wafer. The wafer 300 has the recess RC3. That is, the wafer 300 is a carrier wafer having the recess RC3. The wafer 300 is a transparent wafer. In some embodiments, the wafer 300 may be a glass wafer. In some embodiments, the recess RC3 is not extended to an edge of the wafer 300. In some embodiments, a distance DI between the recess RC3 and the edge of the wafer 300 may be 0.1 mm-6 mm. In some embodiments, a depth DP1 of the recess RC3 may be 1 μm-15 μm.

Figure 3E:
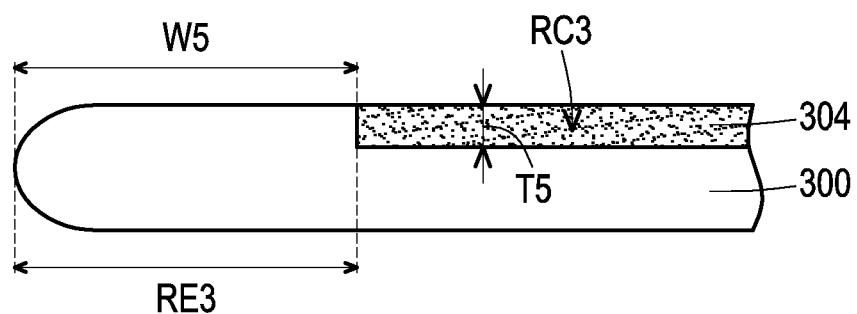

With reference to FIG. 3E, an adhesive layer 304 is formed on the wafer 300. In some embodiments, the adhesive layer 304 is located in the recess RC3. In some embodiments, the adhesive layer 304 is not extended to a top surface of the wafer 300 (i.e., a surface of the wafer 300 in an edge region RE3). In some embodiments, a top surface of the adhesive layer 304 may be aligned with the top surface of the wafer 300. In some embodiments, a thickness T5 of the adhesive layer 304 may be 1 μm-15 μm. In some embodiments, a method of forming the adhesive layer 304 includes, for instance, a spin coating method. In some embodiments, an EBR process may be performed on the adhesive layer 304. In some embodiments, the EBR process may be performed on the edge region RE3 of the wafer 300, and a width W5 of the edge region RE3 may be 0.1 mm-6 mm.

Figure 3F:
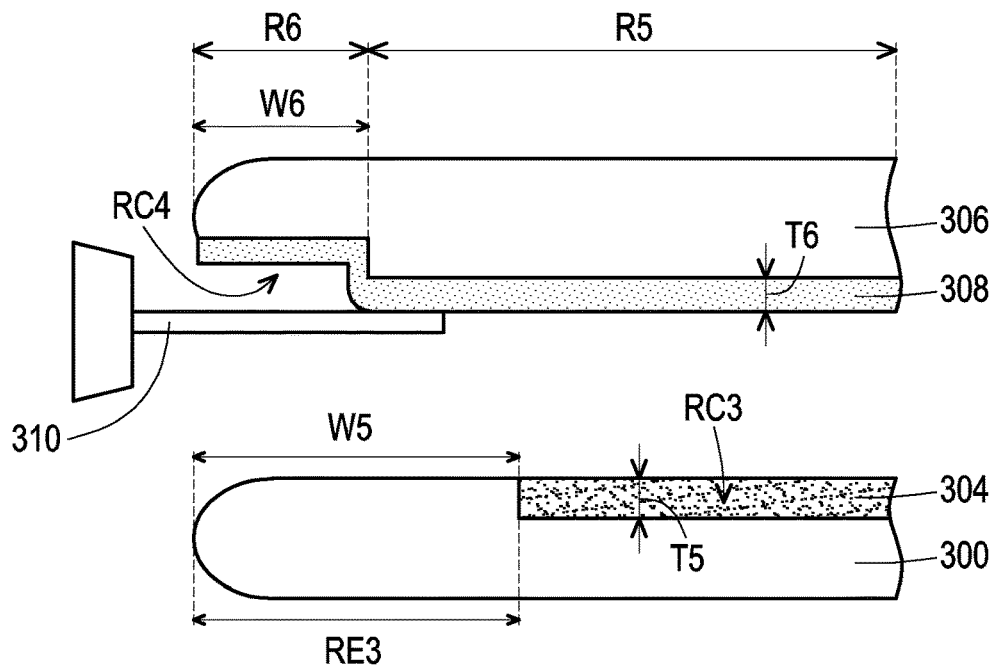
Figure 3G:
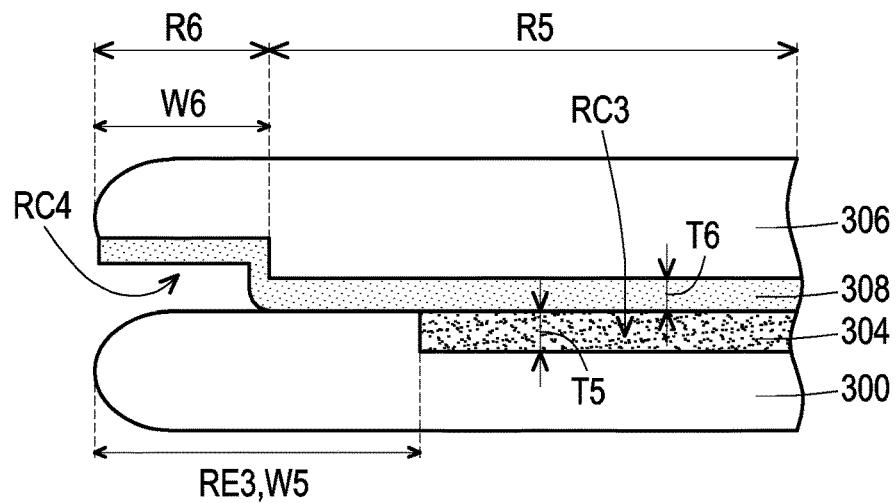

With reference to FIG. 3F and FIG. 3G, a release layer 308 is formed on a wafer 306. In some embodiments, the wafer 306 may be a device wafer. In some embodiments, the wafer 306 may include a valid die region R5 and a trimming region R6. The trimming region R6 is located on one side of the valid die region R5 and adjacent to an edge of the wafer 306. In some embodiments, a width W6 of the trimming region R6 may be 0.1 mm-6 mm. In some embodiments, the wafer 306 may have a recess RC4 in the trimming region R6. In some embodiments, the recess RC4 may be formed by performing a polishing process on the wafer 306 in the trimming region R6. In some embodiments, a thickness T6 of the release layer 308 may be 0.5 μm-5 μm. In some embodiments, a method of forming the release layer 308 includes, for instance, a spin coating method.

Next, the wafer 306 is placed on the wafer 300 by using the handler 310, so that the release layer 308 and the adhesive layer 304 are bonded to each other. In the process of placing the wafer 306 on the wafer 300, since the adhesive layer 304 fills the recess RC3, gaps may be prevented from being generated between the wafer 306 and the wafer 300 in the valid die region R5. In some embodiments, after the release layer 308 and the adhesive layer 304 are bonded to each other, the top surface of the adhesive layer 304 may be aligned with the top surface of the wafer 300. In some embodiments, after the release layer 308 and the adhesive layer 304 are bonded to each other, the release layer 308 may completely cover the valid die region R5. In some embodiments, as shown in FIG. 3G, a space between the wafer 306 and the wafer 300 in the valid die region R5 may be filled with the release layer 308 and the adhesive layer 304. Thereby, the valid die region R5 of the wafer 306 (the device wafer) bonded to the wafer 300 (the carrier wafer) may be prevented from being damaged in a subsequent manufacturing process (e.g., a thinning process). In some embodiments, a space between the wafer 306 and the wafer 300 in the trimming region R6 is not filled with the release layer 308 and the adhesive layer 304. In some embodiments, the handler 310 may be a robot arm.

In this embodiment, as shown in FIG. 3F, in the process of placing the wafer 306 on the wafer 300, the handler 310 may directly contact the release layer 308 on the wafer 306, which should however not be construed as a limitation in the disclosure. In some other embodiments, the release layer 308 may expose the wafer 306 in the trimming region R6, and during the process of placing the wafer 306 on the wafer 300, the handler 310 may directly contact the wafer 306 exposed by the release layer 308. In some other embodiments, the handler 310 may also be configured to place the wafer 300 on the wafer 306, and a position where the handler 310 touches the wafer 300 does not exceed the edge region RE3.

Figure 3H:
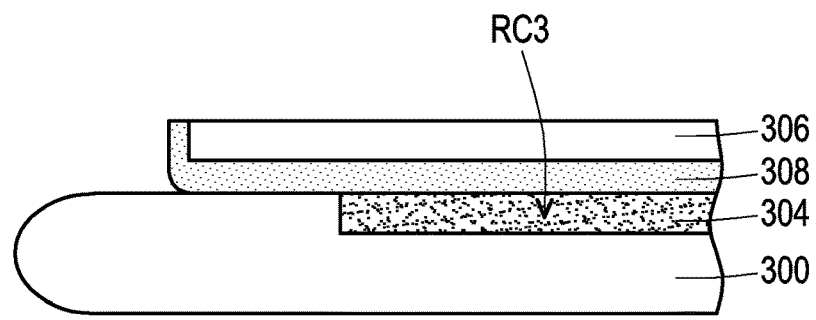

With reference to FIG. 3H, a thinning process may be performed on the wafer 306. In addition, since there is no gap between the wafer 300 and the wafer 306 in the valid die region R5, damages to the valid die region R5 of the wafer 306 in the thinning process may be prevented. In some embodiments, the thinning process includes, for instance, a polishing process, a CMP process, or a combination thereof. In some embodiments, the thinning process may be performed to completely remove a portion of the wafer 306 in the trimming region R6.

Figure 3I:
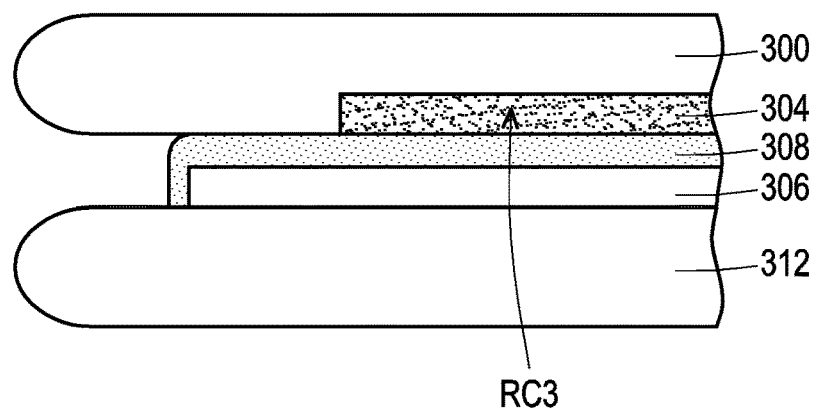

With reference to FIG. 3I, the wafer 306 may be bonded to a wafer 312. In some embodiments, the wafer 312 may be a device wafer. In some embodiments, a method of bonding the wafer 306 and the wafer 312 includes, for instance, a hybrid bonding method or a fusion bonding method.

Figure 3J:
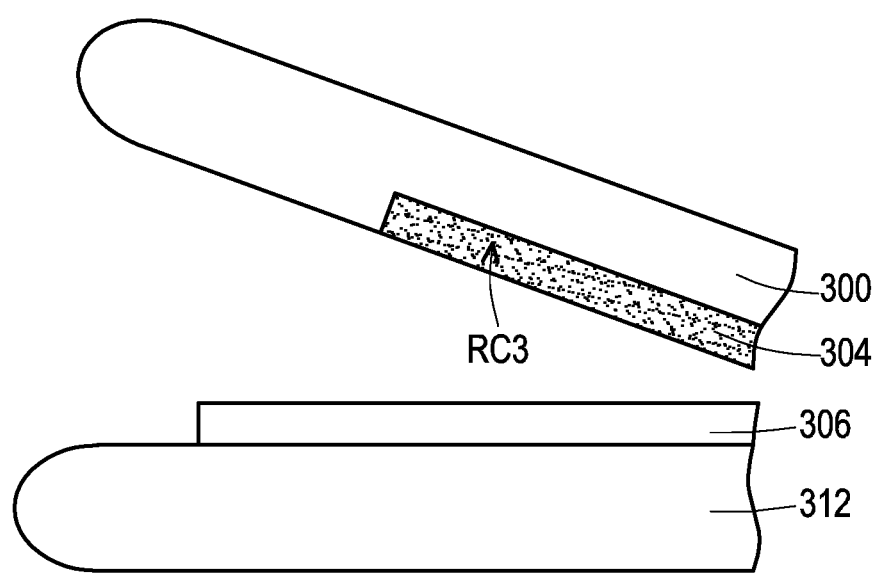

With reference to FIG. 3J, the release layer 308 may be removed, so as to separate the wafer 306 from the wafer 300. In some embodiments, since the wafer 300 is a transparent wafer, the release layer 308 may be removed by a laser. In some embodiments, a cleaning process may be performed on the wafer 306, so as to remove the remaining release layer 308 the wafer 306.

In light of the above embodiment, it may be learned that in the wafer processing method, the wafer 300 (the carrier wafer) has the recess RC3, and the adhesive layer 304 fills the recess RC3. Hence, it is possible to prevent gaps from being generated between the wafer 306 (the device wafer) and the wafer 300 (the carrier wafer) in the valid die region R5. Thereby, the valid die region R5 of the wafer 306 (the device wafer) bonded to the wafer 300 (the carrier wafer) may be prevented from being damaged in a subsequent manufacturing process (e.g., the thinning process).

To sum up, the wafer processing method provided in one or more embodiments of the disclosure and the carrier wafer may prevent the valid die region of the device wafer bonded to the carrier wafer from being damaged in the subsequent manufacturing process (e.g., the thinning process).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A wafer processing method, comprising:
forming a release layer on a first wafer;
forming an adhesive layer on a second wafer, wherein one of the first wafer and the second wafer is a device wafer, and the device wafer comprises a valid die region and a trimming region;
placing the first wafer on the second wafer by a handler, so that the release layer and the adhesive layer are bonded to each other, and the adhesive layer completely covers the valid die region, wherein during the process of placing the first wafer on the second wafer, the handler directly moves the first wafer;
bonding one of the first wafer and the second wafer that is the device wafer to a third wafer; and
removing the release layer to separate the first wafer from the second wafer, wherein the release layer is removed by a laser.

2. The wafer processing method according to claim 1, wherein the first wafer is the device wafer, and the second wafer is a carrier wafer.

3. The wafer processing method according to claim 2, wherein the first wafer comprises the valid die region and the trimming region, and the trimming region is located on one side of the valid die region and adjacent to an edge of the first wafer.

4. The wafer processing method according to claim 3, wherein a space between the first wafer and the second wafer in the valid die region is filled with the release layer and the adhesive layer.

5. The wafer processing method according to claim 3, wherein the first wafer has a recess in the trimming region.

6. The wafer processing method according to claim 5, wherein a space between the first wafer and the second wafer in the trimming region is not filled by the release layer and the adhesive layer.

7. The wafer processing method according to claim 5, further comprising:
performing a thinning process on the first wafer.

8. The wafer processing method according to claim 7, wherein a portion of the first wafer located in the trimming region is completely removed by the thinning process.

9. The wafer processing method according to claim 7, wherein the second wafer is a transparent wafer.

10. The wafer processing method according to claim 1, wherein the first wafer is a carrier wafer, and the second wafer is the device wafer.

11. The wafer processing method according to claim 10, wherein the second wafer comprises the valid die region and the trimming region, and the trimming region is located on one side of the valid die region and adjacent to an edge of the second wafer.

12. The wafer processing method according to claim 11, wherein a space between the first wafer and the second wafer in the valid die region is filled with the release layer and the adhesive layer.

13. The wafer processing method according to claim 11, wherein the second wafer has a recess in the trimming region.

14. The wafer processing method according to claim 13, wherein a space between the first wafer and the second wafer in the trimming region is not filled with the release layer and the adhesive layer.

15. The wafer processing method according to claim 13, further comprising:
performing a thinning process on the second wafer.

16. The wafer processing method according to claim 1, wherein after the release layer and the adhesive layer are bonded to each other, the release layer completely covers the valid die region.

* * * * *